US007330236B2

(12) United States Patent
Hasegawa

(10) Patent No.: US 7,330,236 B2
(45) Date of Patent: Feb. 12, 2008

(54) EXPOSURE APPARATUS, AND DEVICE MANUFACTURING METHOD USING THE SAME

(75) Inventor: Noriyasu Hasegawa, Utsunomiya (JP)

(73) Assignee: Canon Kabushiki Kaisha, Ohta-ku, Tokyo (JP)

( * ) Notice: Subject to any disclaimer, the term of this patent is extended or adjusted under 35 U.S.C. 154(b) by 52 days.

(21) Appl. No.: 10/928,527

(22) Filed: Aug. 27, 2004

(65) Prior Publication Data

US 2005/0110966 A1    May 26, 2005

(30) Foreign Application Priority Data

Aug. 29, 2003    (JP)   ............................ 2003-209519
Jul. 20, 2004    (JP)   ............................ 2004-211693

(51) Int. Cl.
     *G03B 27/52*      (2006.01)
     *G03B 27/42*      (2006.01)
     *G03B 27/32*      (2006.01)

(52) U.S. Cl. ............................ 355/30; 355/53; 355/77
(58) Field of Classification Search ................. 355/30, 355/53, 77; 165/289; 359/845; 378/34
See application file for complete search history.

(56) References Cited

U.S. PATENT DOCUMENTS

| | | | | |
|---|---|---|---|---|
| 3,800,781 | A * | 4/1974 | Zalucki | ....................... 600/562 |
| 4,023,559 | A * | 5/1977 | Gaskell | ....................... 600/572 |
| 4,347,846 | A * | 9/1982 | Dormia | ....................... 606/127 |
| 4,730,949 | A * | 3/1988 | Wilson | ....................... 401/132 |
| 4,786,947 | A * | 11/1988 | Kosugi et al. | ............... 355/30 |
| 4,952,204 | A * | 8/1990 | Korteweg | ....................... 604/1 |
| 4,980,563 | A * | 12/1990 | George et al. | ............ 250/492.2 |
| 5,813,233 | A * | 9/1998 | Okuda et al. | ................. 62/3.7 |
| 5,877,843 | A * | 3/1999 | Takagi et al. | ................. 355/30 |
| 6,153,877 | A * | 11/2000 | Ashida | ....................... 250/216 |
| 6,290,677 | B1 * | 9/2001 | Arai et al. | ................... 604/183 |
| 6,459,472 | B1 | 10/2002 | De Jager et al. | |
| 6,599,296 | B1 * | 7/2003 | Gillick et al. | ............... 606/108 |
| 6,702,759 | B2 * | 3/2004 | Pevoto | ....................... 600/562 |
| 6,731,371 | B1 * | 5/2004 | Shiraishi | ....................... 355/30 |
| 6,765,647 | B1 * | 7/2004 | Nishi | ....................... 355/55 |
| 6,793,648 | B2 * | 9/2004 | Oslund et al. | ............... 604/160 |
| 6,856,475 | B2 * | 2/2005 | Nasu et al. | .................. 359/820 |
| 2001/0043314 | A1 * | 11/2001 | Ota | ............................ 355/30 |
| 2002/0027645 | A1 * | 3/2002 | Shiraishi | ....................... 355/30 |
| 2002/0082552 | A1 * | 6/2002 | Ding et al. | ............ 604/103.02 |
| 2002/0088940 | A1 * | 7/2002 | Watanabe et al. | ........... 250/310 |
| 2003/0073979 | A1 * | 4/2003 | Naimark et al. | ......... 604/891.1 |
| 2003/0112512 | A1 * | 6/2003 | Nagae | ....................... 359/507 |
| 2003/0129183 | A1 * | 7/2003 | Spillert et al. | ........... 424/94.64 |
| 2003/0169520 | A1 * | 9/2003 | Goldstein | .................... 359/845 |
| 2004/0035570 | A1 * | 2/2004 | Hara | ........................... 165/289 |
| 2004/0051984 | A1 * | 3/2004 | Oshino et al. | ............... 359/845 |
| 2004/0165161 | A1 * | 8/2004 | Hara | ........................... 355/30 |
| 2004/0182565 | A1 * | 9/2004 | Nomoto | ....................... 165/275 |
| 2004/0207825 | A1 * | 10/2004 | Wagner et al. | ................. 355/30 |
| 2004/0236186 | A1 * | 11/2004 | Chu | ........................... 600/215 |
| 2004/0262541 | A1 * | 12/2004 | Honda et al. | ............. 250/492.2 |
| 2005/0073663 | A1 * | 4/2005 | Miyajima | ..................... 355/30 |

* cited by examiner

*Primary Examiner*—Alan Mathews
(74) *Attorney, Agent, or Firm*—Morgan & Finnegan, L.L.P.

(57) ABSTRACT

Disclosed is an exposure apparatus having a specific structure that includes a cold trap plate for attracting contaminant substances which might cause a decrease of reflectance of a mirror when adhered thereto, and a radiation shield member for preventing excessive cooling of the mirror or the like by the cold trap plate.

10 Claims, 10 Drawing Sheets

EXPOSURE APPARATUS, AND DEVICE MANUFACTURING METHOD USING THE SAME

FIELD OF THE INVENTION AND RELATED ART

This invention relates to an exposure apparatus for transferring a fine circuit pattern.

As a lithographic process for production of a fine semiconductor device such as semiconductor memory or logic circuit, there is a reduction projection exposure method using ultraviolet rays.

The smallest size that can be transferred by the reduction projection exposure process is proportional to the wavelength of light used for the transfer, and also it is inversely proportional to the numerical aperture of a projection optical system. This has facilitated shortening of the wavelength of exposure light to be used for transfer of fine circuit patterns, and actually the wavelength of ultraviolet light has been shortened from Hg lamp i-line (wavelength 365 nm) to KrF excimer laser (wavelength 248 nm) and then to ArF excimer laser (wavelength 193 nm).

However, semiconductor devices are being miniaturized rapidly, and there is a limit in the lithography using ultraviolet light as described above. Thus, for efficient printing of very fine pattern narrower than 0.1 μm, reduction projection exposure apparatuses using extreme ultraviolet light (EUV light) of a wavelength of about 10 to 15 nm, yet shorter than the above-described ultraviolet light, are being developed.

With respect to light in such EUV wavelength region, absorption of light by a substance becomes very large. Therefore, a lens system that is based on refraction of light and that can be used in a visible light region or in a wavelength region of ultraviolet light such as described above, is not practical and a reflection optical system is used in place of it. Also, as regards a reticle, a reflection type reticle of the type that a pattern to be transferred is formed by an absorptive material provided on a mirror member.

Reflection type optical elements that constitute an exposure apparatus using EUV light may include a multilayered-film mirror and an oblique-incidence total reflection mirror. Since the real part of the refractive index of a mirror material with respect to the light of EUV wavelength region is slightly smaller than 1, in order to make it sure to cause total reflection at the mirror surface, the EUV light must be incident with a small angle with respect to the mirror reflection surface. Normally, with oblique incidence within a range of a few degrees as measured from the reflection surface, a high reflectance of tens per cent or more is obtainable. However, since the degree of freedom in optical design is small, it is difficult to incorporate a total reflection mirror into a projection optical system.

As a mirror for EUV light arranged so that EUV light is incident at an incidence angle near right-angle incidence, a multilayered-film mirror wherein two types of materials having different optical constants are alternately layered upon a reflection surface is used. Upon the surface of a glass substrate having been polished into a precise surface shape, molybdenum and silicone are alternately layered. The thicknesses of these layers are, for example, about 0.2 nm for molybdenum layer and about 0.5 nm for silicone layer. The number of layers (layer pairs) is about twenty. The sum of the thicknesses of the two types of materials is called "film period". In this example, the film period is 0.2 nm+0.5 nm=0.7 nm.

When EUV light is incident on such multilayered-film mirror, EUV light of a particular wavelength is reflected.

If the incidence angle is θ, the wavelength of EUV light is λ, and the film period is d, then only such EUV light as having a narrow bandwidth about λ that approximately satisfies the relation of Bragg's equation "2×d×sinθ=λ" can be reflected with good efficiency. The bandwidth there is about 0.6 to 1 nm.

The reflectance of a multilayered-film mirror with respect to EUV light is about 0.7 at the best, and thus there is a large loss of light quantity at each multilayered-film mirror. The light not reflected by the multilayered-film mirror is absorbed by the multilayered film or the substrate of that mirror, and most of the energy thereof is transformed into heat. Thus, there is a possibility that, due to this heat, the multilayered-film mirror may expand or deform thereby to cause degradation of the performance of the whole optical system.

For exposure of a wide exposure region with mirrors of smallest number, an exposure method in which a reticle (original) and a wafer (member to be exposed) are scanned simultaneously to transfer the pattern of the reticle onto the wafer, has been developed. FIG. 8 shows the structure of such scan type exposure apparatus (called a "scanner"), as an example. The scan type exposure apparatus of this example comprises an EUV light source, an illumination optical system, a reflection type reticle, a projection optical system, a reticle stage, a wafer stage, an alignment optical system, a vacuum system, and so on.

The EUV light source may comprise a laser plasma light source, for example. The laser plasma light source has a structure that a pulse laser light of large intensity is projected on a target material supplied from a target supplying apparatus, disposed outside a vacuum container, whereby a high-temperature plasma is produced, and EUV light of wavelength of about 13 nm, for example, emitted therefrom is used. The target material may be metal thin film, inactive gas, or liquid drops, for example. By means of gas jet, for example, the material is supplied into the vacuum container. For obtaining a higher average intensity of EUV light emitted, the repetition frequency of the pulse laser should be higher. Usually, the laser is operated at a repetition frequency of a few kHz.

The illumination optical system comprises a plurality of multilayered film mirrors or oblique incidence mirrors, an optical integrator, and the like. A leading condensing mirror serves to collect EUV light approximately isotropically emitted from the laser plasma. The optical integrator has a function for illuminating the reticle uniformly at a predetermined numerical aperture. Also, there is an aperture in the illumination optical system, being disposed at a position conjugate with the reticle, for restricting the region to be illuminated into an arcuate shape.

The projection optical system uses plural mirrors. Although the utilization efficiency of EUV light is higher with a smaller number of mirrors, aberration correction becomes more difficult to achieve. Mirrors of about four to six are necessary for the aberration correction. As regards the shape of the mirror reflection surface, it may be a spherical surface of convex or concave shape, or it may be an aspherical surface. The numerical aperture NA is about 0.1 to 0.2.

Each mirror is made from a substrate of material having high rigidity and stiffness and small thermal expansion coefficient, such as a silicon carbide or low thermal-expansion glass, for example. By grinding and polishing the substrate to form a predetermined reflection surface shape and, thereafter, a multilayered film of molybdenum/silicon, for example, is provided on the reflection surface. In a case where the incidence angle is uneven with the position on the mirror surface, as seen from the Bragg's equation mentioned above, it is possible that the reflectance rises in dependence upon the position if the multilayered film has a constant film period, this being a factor for causing shift of the wavelength of EUV light. In order to avoid this, the multilayered film should be formed with a film period distribution, enabling efficient reflection of the EUV light of the same wavelength throughout the mirror surface.

The reticle stage and the wafer stage are provided with a mechanism for scanning these stages synchronously, at a speed ratio proportional to the reduction magnification. Here, the scan direction along the reticle or wafer surface is denoted by X, and a direction perpendicular thereto is denoted by Y. A direction perpendicular to the reticle or wafer surface is denoted by Z.

The reticle is held by a reticle chuck mounted on the reticle stage. The reticle stage is provided with a mechanism for moving it in X direction at high speed. Also, it is provided with a fine-motion mechanism for causing motions in X, Y and Z directions as well as motions in rotational directions about these axes, respectively, for achieving the reticle positioning. The position and attitude of the reticle stage can be measured by use of laser interferometers, and the position and the attitude are controlled on the basis of the measurement result.

The wafer is held on the wafer stage by means of a wafer chuck. The wafer stage is provided with a mechanism for moving it in X direction at high speed, like the reticle stage. Also, it is provided with a fine-motion mechanism for causing motions in X, Y and Z directions as well as motions in rotational directions about these axes, respectively, for achieving the wafer positioning. The position and attitude of the wafer stage can be measured by use of laser interferometers, and the position and the attitude are controlled on the basis of the measurement result.

An alignment detecting mechanism measures a positional relationship between the reticle position and the optical axis of the projection optical system as well as a positional relationship between the wafer position and the optical axis of the projection optical system. Then, the positions and angles of the reticle stage and the wafer stage are set so that a projected image of the reticle is registered with a predetermined position on the wafer.

A focus position detecting mechanism measures the focus position in Z direction of the wafer surface. By controlling the position and angle of the wafer stage, the wafer surface can be held at the imaging position of the projection optical system, continuously during the exposure operation.

As a single scan exposure upon the wafer is completed, the wafer stage is moved stepwise in X and Y directions, toward a subsequent scan exposure start position. Again, the reticle,stage and the wafer stage are synchronously scanned in X direction at a speed ratio proportional to the reduction magnification of the projection optical system.

In the manner described above, while a reduced and projected image of a reticle is being imaged upon a wafer, the reticle and the wafer are synchronously scanned. This operation is repeated (step-and-scan), whereby the pattern of the reticle is transferred to the whole wafer surface.

The EUV light can be absorbed by a gas, largely. For example, if EUV light of a wavelength 13 nm is propagated through 1 m within a space being filled with an air at 10 Pa, the transmittance of the EUV light is about 50%. Similarly, if EUV light is propagated through 1 m within a space filled with a relatively high transmissivity gas of 10 Pa, the transmittance of the EUV light is about 88% (helium), 71% (argon) or 98% (hydrogen). In order to avoid absorption by gas, replacement with a high transmissivity gas such as helium should be made; most space through which EUV light is propagated should be maintained at a pressure not greater than $10^{-1}$ Pa, more preferably, not greater than $10^{-3}$ Pa; and additionally, the partial pressure of low transmissivity gas such as oxygen or moisture content should be kept as low as possible.

If any carbon containing molecules such as hydrocarbon remain in a space where an optical element to be irradiated with EUV light is disposed, there is a possibility that carbon is gradually deposited on the surface of the optical element as a result of irradiation with light. Since it absorbs EUV light, the reflectance would be lowered thereby. In order to prevent carbon deposition, the partial pressure of carbon containing molecules in the space where the optical element to be irradiated with EUV light is placed should be kept at least at a level not greater than $10^{-4}$ Pa, more preferably, not greater than $10^{-6}$ Pa.

However, the exposure apparatus should perform repeated operations of loading a semiconductor wafer being coated with a resist (photosensitive material) into the exposure apparatus from the outside thereof; transferring pattern information of a reticle while mutually scanning the loaded semiconductor wafer and the reticle; and then unloading the wafer. To this end, the exposure apparatus is equipped with many driving mechanisms, and this leads to a possibility that, due to friction or the like, outgassing that may cause a decrease of mirror transmittance is produced.

Further, the wafer stage has a very large surface area because it bears driving mechanisms such as a moving mechanism for scan exposure and a mechanism for conveying the wafer. Since outgassing from a member having a large surface area such as above can not easily be removed completely, there is a difficulty in providing high vacuum in the exposure space.

Furthermore, although the resist applied to a wafer is baked by heating prior to the exposure, yet it is an organic substance. If, therefore, it is introduced into a vacuum ambience, organic matters constituting the resist or carbon compounds which are decomposed materials from the organic matters may be produced from the resist, and they may be scattered into the apparatus being maintained at vacuum. Moreover, while wafers are loaded into the exposure apparatus from the outside atmosphere, during the wafer loading it is very difficult to remove air components, containing moisture, adhered to each wafer in a short time period. Thus, these components will be released from the wafers and scattered into the vacuum. Because of these outgassing from the wafer or the resist, it is very difficult to maintain a high-vacuum condition as described above.

Although, in that occasion, it may be possible to keep high vacuum by using a large-capacity exhaust pump, for example, what should be considered here is the component. That is, it is important to prevent scatter of moisture contents or carbon containing molecules into the exposure apparatus, particularly, into the space where a reticle or mirrors are disposed.

As a measure for protecting a mirror against outgassing from a wafer or the like, U.S. Pat. No. 6,459,472 proposes a structure that an intervening space surrounding mirrors, disposed between a reticle and a wafer, is provided; an opening of conical shape is defined at an exit of light from the intervening space toward the wafer; and a gas (hydrogen, argon or krypton) that does not substantially absorb EUV light is discharged at the side face of the opening, toward the wafer.

However, in order to obtain a desired prevention effect, the pressure inside the opening has to be raised up to 5 Pa to 10 Pa. Also, since the area of the opening gradually decreases as approaching toward the wafer surface, most of the supplied gases would be emitted to the projection optical system. As a result, the pressure in the space accommodating the projection optical system rises and the transmittance of EUV light decreases. This leads to degradation of the throughput.

SUMMARY OF THE INVENTION

It is accordingly an object of the present invention to solve at least one of the inconveniences described above, and particularly, to protect a mirror or mirrors against outgassing from a wafer or the like.

In accordance with an aspect of the present invention, there is provided an exposure apparatus which comprises: an illumination optical system for illuminating a reticle with extreme ultraviolet light; a projection optical system having a plurality of reflective optical elements, for directing light from the reticle to an object to be exposed; a chamber for surrounding a light path from the reticle to the object to be exposed; and a cold trap provided inside said chamber.

In one preferred form of this aspect of the present invention, the ambience inside the chamber is maintained in a vacuum range from medium vacuum to ultra-high vacuum. The pressure of the ambience may be in a range from $10^{-3}$ Pa to $10^{-8}$ Pa, more preferably, from $10^{-4}$ Pa to $10^{-7}$ Pa.

In one preferred form, the cold trap may include a radiation shield member effective to prevent radiation cooling of a predetermined member by the cold trap. The predetermined member may be at least one of the reflective optical elements.

In one preferred form, the radiation shield member may be provided to surround at least one of the reflective optical elements. The predetermined member may be the chamber described above.

In one preferred form, a gas supplying device for supplying a gas into a space where the cold trap is disposed may be provided. Further, a gas supplying device for supplying an inactive gas into a space surrounded by the radiation shield member and at least one reflective optical element, may be provided. The gas to be supplied by the gas supplying device may preferably be inactive gas such as argon, helium, or nitrogen, for example.

In one preferred form, the radiation shield member may be provided to surround the cold trap. Also, preferably, there may be a gas exhausting device for discharging the gas out of the space as surrounded by the radiation shield member that surrounds the cold trap.

In one preferred form, the chamber includes a reticle-side chamber and a wafer-side chamber disposed in this order along the light path of extreme ultraviolet light and from the reticle side, the reticle-side chamber and the wafer-side chamber being arranged to allow flow and passage (in back and forth directions) of gas and light between these chambers. The cold trap may preferably be disposed inside the wafer-side chamber. Also, preferably, there may be a gas supplying device for supplying an inactive gas to the wafer-side chamber.

Here, if the pressure inside the reticle-side chamber is Por, the pressure inside the wafer-side chamber is Pow and the pressure of the space surrounding the stage is Pw, the exposure process may desirably be carried out while satisfying a relation:

Pow≧Pw, Por

More preferably, the following relation may be satisfied:

Pw<Por

Furthermore, a cold trap plate having an opening may preferably be disposed at an opening for the exposure light from the wafer-side chamber to the object to be exposed.

Where the pressure inside the reticle-side chamber is Por, the pressure inside the wafer-side chamber is Pow and the pressure of the space surrounding the stage is Pw, the cold trap plate may preferably be reactivated while satisfying a relation:

Por>Pow, Pw

More preferably, the cold trap plate may be reactivated while the following relation is satisfied:

Pow>Pw

The exposure apparatus may further comprise a gas exhausting device for discharging a gas out of the wafer-side space, and a gas supplying device for supplying a gas to the reflective optical element disposed in the wafer-side space or into the space that surrounds the reflective optical element. The gas exhausting device and the gas supplying device may preferably operate simultaneously during reactivation (refresh) of the cold trap plate.

The pressure in the wafer-side space during reactivation of the cold trap plate may preferably be 1-100 Pa.

The pressure in the wafer-side space during the exposure may preferably be 0.1-10 Pa.

Temperature control for at least one of the radiation shield member and the cold trap plate may preferably be carried out by use of a heat generating mechanism such as a heater, for example.

Preferably, there may be measuring means for measuring the temperature of at least one optical element, and the temperature of the optical element may preferably be controlled in a predetermined range on the basis of the result of measurement made by said temperature measuring means.

The cold trap plate may desirably be a cryo-panel. Also, preferably, there may be exhausting means arranged for selectively exhausting the reticle-side space and the wafer-side space. Moreover, preferably, there may be a gas supplying device arranged for selectively supplying an inactive gas to these spaces.

In accordance with another aspect of the present invention, there is provided a device manufacturing method, comprising the steps of: exposing an object to be exposed, by use of an exposure apparatus as recited above; and developing the exposed object.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
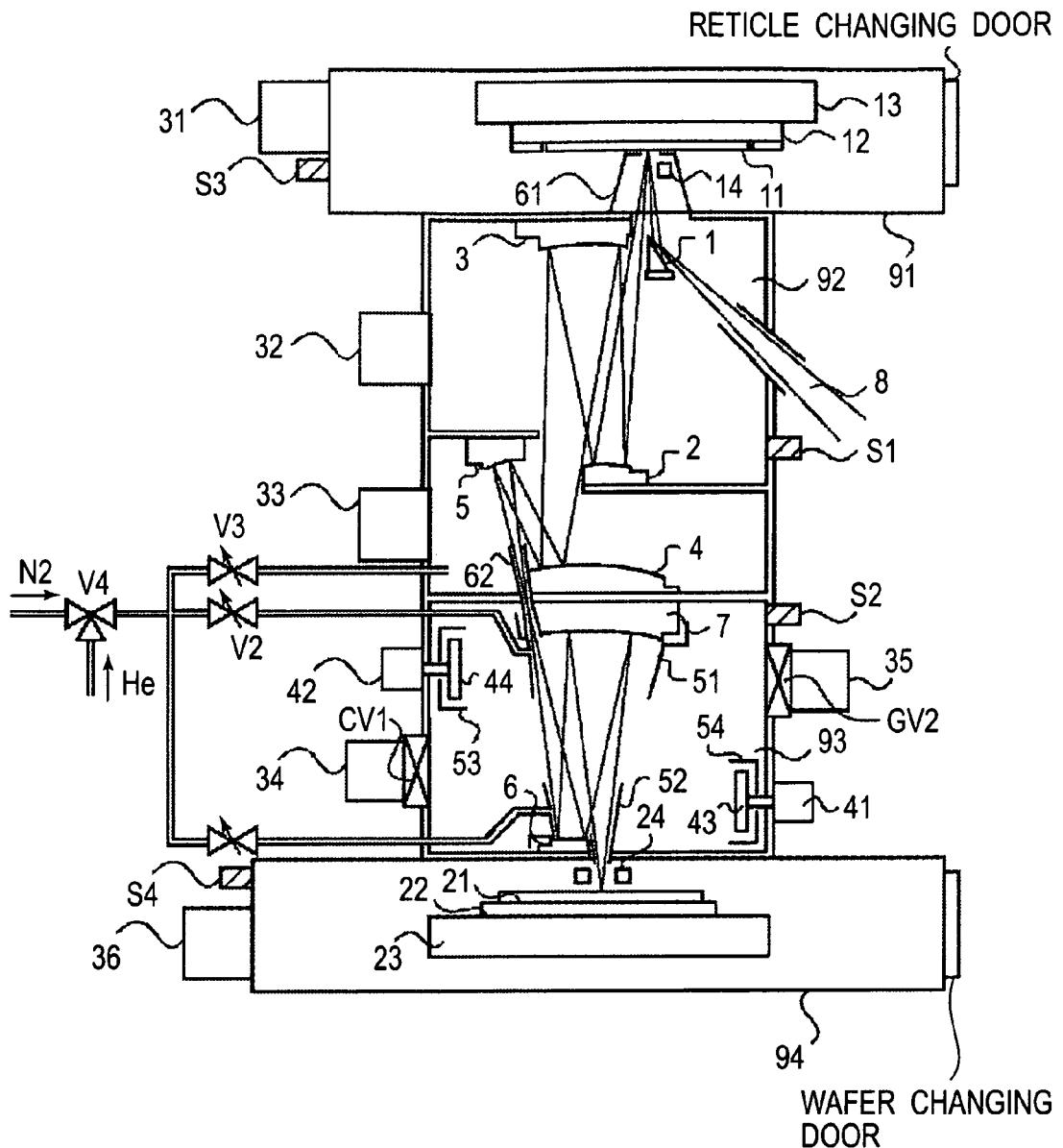
FIG. 1 is a schematic view of a general structure of a EUV exposure apparatus according to the present invention.

FIG. 1 is a side view schematically showing the structure of a lithographic system according to one preferred embodiment of the present invention.

In FIG. 1, denoted at 11 is a reflection type reticle, and denoted at 12 is a reticle holding device for holding the reticle 11. Denoted at 13 is a reticle stage for moving the reticle 11 as held by the reticle holding device. Denoted at 8 is extreme ultraviolet (EUV) light that is exposure light. Denoted at 1 is a reticle illuminating mirror, and denoted at 2-7 are first to sixth mirrors that constitute a projection optical system. Denoted at 14 is a reticle alignment optical system. Denoted at 21 is a wafer, and denoted at 22 is a wafer chuck for holding the wafer 21. Denoted at 23 is a wafer stage for moving the wafer 21 as held by the wafer chuck 22, and denoted at 24 is a wafer alignment optical system.

The EUV light source comprises a laser plasma light source, not shown. It has such structure that a pulse laser light of large intensity emitted from an excitation pulse laser is projected on a target material supplied from a target supplying apparatus, disposed outside a vacuum container, whereby a high-temperature plasma is produced, and EUV light of wavelength of about 13 nm, for example, emitted therefrom is used. The target material may be metal thin film, inactive gas, or liquid drops, for example. By means of gas jet, for example, the material is supplied into the vacuum container. For obtaining a higher average intensity of EUV light emitted, the repetition frequency of the pulse laser should be higher. Usually, the laser is operated at a repetition frequency of a few kHz.

The illumination optical system, not shown, comprises a plurality of multilayered film mirrors or oblique incidence mirrors, an optical integrator, and the like. It functions to illuminate the reticle uniformly, at a predetermined numerical aperture.

The projection optical system uses plural mirrors. Although the utilization efficiency of EUV light is higher with a smaller number of mirrors, aberration correction becomes more difficult to achieve. Mirrors of about four to six are necessary for the aberration correction. As regards the shape of the mirror reflection surface, it may be a spherical surface of convex or concave shape, or it may be an aspherical surface. The numerical aperture NA is about 0.1 to 0.2.

Each mirror is made from a substrate of material having high rigidity and stiffness and small thermal expansion coefficient, such as a silicon carbide or low thermal-expansion glass, for example. By grinding and polishing the substrate to form a predetermined reflection surface shape and, thereafter, a multilayered film of molybdenum/silicon, for example, is provided on the reflection surface.

The reticle stage 13 and the wafer stage 23 are provided with a mechanism for scanning these stages synchronously, at a speed ratio proportional to the reduction magnification. Here, the scan direction along the reticle or wafer surface is denoted by X, and a direction perpendicular thereto is denoted by Y. A direction perpendicular to the reticle or wafer surface is denoted by Z.

The reticle 11 is held by the reticle chuck 12 mounted on the reticle stage 13. The reticle stage 13 is provided with a mechanism for moving it in X direction at high speed. Also, it is provided with a fine-motion mechanism for causing motions in X, Y and Z directions as well as motions in rotational directions about these axes, respectively, for achieving the positioning of the reticle 11. The position and attitude of the reticle stage 13 can be measured by use of laser interferometers, not shown, and the position and the attitude are controlled on the basis of the measurement result.

The wafer 21 is held on the wafer stage 23 by means of the wafer chuck 22. The wafer stage 23 is provided with a mechanism for moving it in X direction at high speed, like the reticle stage 13. Also, it is provided with a fine-motion mechanism for causing motions in X, Y and Z directions as well as motions in rotational directions about these axes, respectively, for achieving the positioning of the wafer 21. The position and attitude of the wafer stage 23 can be measured by use of laser interferometers, and the position and the attitude are controlled on the basis of the measurement result.

An alignment detecting mechanism 14 measures a positional relationship between the reticle position and the optical axis of the projection optical system as well as a positional relationship between the wafer position and the optical axis of the projection optical system. Then, the positions and angles of the reticle stage 13 and the wafer stage 23 are set so that a projected image of the reticle is registered with a predetermined position on the wafer.

A focus position detecting mechanism 24 measures the focus position in Z direction of the wafer surface. By controlling the position and angle of the wafer stage, the wafer surface can be held at the imaging position of the projection optical system, continuously during the exposure operation.

As a single scan exposure upon the wafer 21 is completed, the wafer stage 23 is moved stepwise in X and Y directions, toward a subsequent scan exposure start position. Again, the reticle stage 13 and the wafer stage 23 are synchronously scanned in X direction at a speed ratio proportional to the reduction magnification of the projection optical system.

In the manner described above, while a reduced and projected image of a reticle is being imaged upon a wafer, the reticle and the wafer are synchronously scanned. This operation is repeated (step-and-scan), whereby the pattern of the reticle is transferred to the whole wafer surface.

The exposure apparatus is structured so that a spatial differential pressure is produced inside the exposure apparatus by use of a partition wall or a diaphragm, having an opening for allowing passage of the exposure light.

[Reticle Stage and 1st Light-Path Space]

First of all, there is a shielding member (partition wall) 61 between a reticle stage space 91, that surrounds the reticle and the reticle stage, and a first light-path space 92 that surrounds the first to third mirrors of the projection optical system. This partition wall is formed with an opening for allowing passage of illumination light for illuminating the reticle, exposure light coming from the reticle, or alignment light. Here, there is a clearance between the reticle stage space 91 and the first light-path space 92 through which a gas can flow therebetween, and it is held at 1 mm or less (in this embodiment, a clearance of not greater than 1 mm is maintained between the shielding member and the reticle surface), whereby a differential pressure is produced between the reticle space and the first light-path space. In this example, the pressure of the first light-path space is made higher than the pressure of the reticle space.

More specifically, the reticle stage space 91 is communicated with an exhausting device 31 such as a turbo molecular pump, for example, such that a predetermined pressure can be maintained therein. The inside pressure of the space 91 is monitored by a pressure sensor S3. The first light-path space 92 is communicated with exhausting devices 32 and 33, and a predetermined pressure can be maintained therein. The inside pressure of this space is monitored by a pressure sensor S1. With this structure, a differential exhausting system is constructed between the reticle stage space 91 and the first light-path space 92, such that it is now possible to reduce the amount of entry of outgassing produced in the reticle stage space 91 into the first light-path space 92. There are two exhausting devices in this example, but only one exhausting device or, alternatively, three or more exhausting devices may be used.

[1st Light-Path Space and 2nd Light-Path Space]

Second, there is a diaphragm member 62 between the first light-path space 92 and the second light-path space 93, the diaphragm member corresponding to the shielding member described hereinbefore. The diaphragm member 62 defines an exit from the first light-path space 92 for the exposure light coming from the reticle and passing through the first light-path space, as well as an entrance for the second light-path space 93. Also, through the opening of this diaphragm member 62, the first and second light-path spaces are communicated with each other, and a differential pressure is created therebetween. The second light-path space is connected to an exhausting device 34 through a gate valve GV1 and also to another exhausting device 35 through a gate valve GV2. The pressure inside the light-path space 93 is monitored by a pressure sensor S2. In this embodiment, the pressure inside the first light-path space 92 is made lower than the pressure of the second light-path space 93 on the basis of the detection by the pressure sensor and by use of the exhausting devices and the like.

Disposed inside the second light-path space 93 are cryo-panels 43 and 44 which are connected to cryo-refrigerators 41 and 42, respectively. The cryo-panel is a member being set at a temperature lower than the temperature inside the second light-path space (preferably, between 40 K to 200 K), and it has a function for attracting substances floating in the second light-path space. Further, in order to prevent or reduce radiation cooling of the chamber and mirrors by means of the cryo-panels 43 and 44, there are radiation shielding members 51, 52, 53 and 54. The radiation shield 51 is disposed so as to surround the sixth mirror 7 of the projection system, thereby to suppress cooling of the mirror 7. The radiation shield 52 is disposed so as to surround the fifth mirror 6 of the projection system, thereby to suppress cooling of the mirror 6. The radiation shields 53 and 54 are disposed so as to suppress cooling of the chamber. As an alternative, the mirror may be cooled by use of a cryo-panel. In that occasion, a temperature sensor for detecting the temperature of the mirror (preferably, through non-contact detection) may preferably be used, and the temperature of at least one of the radiation shield and the cryo-panel may preferably be adjusted on the basis of the detection by the temperature sensor.

The light-path spaces 92 and 93 are provided with gas supplying devices, with valves V1-V3, for supplying an inactive gas such as nitrogen or helium into these spaces. Also, by means of a valve V4, the supply of nitrogen and helium can be switched as required. As regards the inactive gas supplying valves, each light-path space may have a single valve or, alternatively, plural valves. As a further alternative, only the first light-path space 92 may have a valve, or only the second light-path space 93 may have one. The gas is not limited to nitrogen and helium. A gas such as argon or krypton may be supplied.

In this case, the temperature control may be performed with a structure that heat generating means such as a heater is connected to at least one of the radiation shield and the cryo-panel to adjust the temperature thereof. Alternatively, the temperature may be adjusted by turning on and off the cryo-refrigerator.

As regards the radiation shields 53 and 54, in order to prevent the chamber from being cooled by the cryo-panel, preferably they should be set at the same temperature as the outside atmosphere where the exposure apparatus is installed. By setting the radiation shields 51 and 52 at a temperature lower than the radiation shields 53 and 54, temperature rise of the mirrors 6 and 7 due to the exposure light can be avoided. Namely, each radiation shield may be set at a different temperature to thereby reduce heat generation of optical components due to the exposure light, by using the radiation cooling through the cryo-panels.

[2nd Light-Path Space and Wafer Stage Space]

A differential pressure is produced between the second light-path space 93 and the wafer stage space 94, by means of a partition wall 52 having an opening for allowing passage of the exposure light. The wafer stage space 94 is communicated with an exhausting device 36, and the pressure inside the wafer stage space 94 is monitored by a pressure sensor S4. Here, the member that is formed with the opening for allowing passage (back and forth) of the gas between the second light-path space and the wafer stage space is not limited to the partition wall 52 which serves also as a radiation shield. A member such as a shielding member 61 separate from the radiation shield may be provided.

Figure 2:
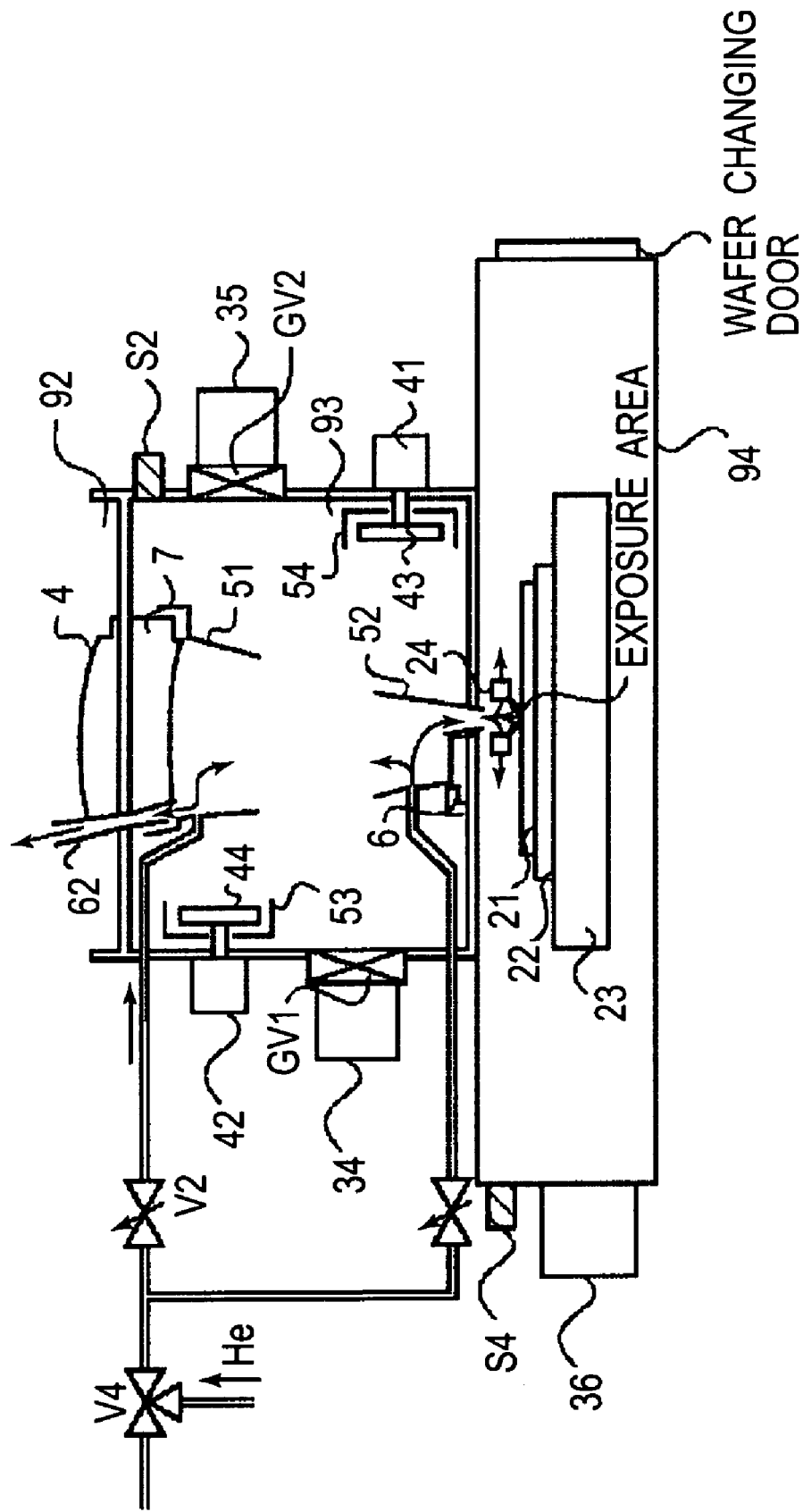
FIG. 2 is a schematic view for explaining the flow of gas in a first embodiment of the present invention.

FIG. 2 is an enlarged view of the light path space 93 and the wafer stage space 94.

Outgas (contaminant substance) produced in the wafer stage space 94 can be reduced by differential exhaustion as being done in the reticle stage space 91. However, contamination (contaminant substance) produced from the resist on the wafer surface during the exposure process can not be reduced thereby. In consideration of it, the valve V4 is switched to choose the helium gas, and the gas is supplied into the second light-path space 93 through the valves V1 and V2. The helium gas applied through the valves V1 and V2 is supplied to the space surrounded by the radiation shield 51 inside the second light-path space 93 and by the sixth mirror 7 of the projection system, and also to the space surrounded by the radiation shield 52 and by the fifth mirror 6 of the projection system, to ensure that the helium concentration becomes highest in the neighborhood of the mirrors.

The helium gas supplied to the second light-path space 93 is discharged to the first-light path space 92 through the diaphragm member 62 and to the wafer stage space 94 through the radiation shield 52. Here, the pressure inside the second light-path space 93 is controlled at 0.1 to 10 Pa and, by doing so, it is possible to prevent entry of contamination produced from the wafer surface in the exposure process, into the second exposure space or first exposure space.

The temperature of the cryo-panel used in the second light-path space is controlled at about 100 K and, since it attracts substances floating in the second light-path space, it has a function as like an exhausting system. When a cryo-panel of about 100 K is used, there is no possibility that the helium gas having a low melting point is attracted to the cryo-panel in the second light-path space 93, whereas any contamination entering the second light-path space is attracted to the cryo-panel. Thus, while suppressing the helium consumption, deposition of contamination on the mirror or the like can be well reduced. The exposure process is carried out while closing the gate valves GV1 and GV2 connected to the exhausting devices 34 and 35. However, for the sake of keeping a stable condition along the path of exposure light, slight gas exhausting and/or gas supplying may be done.

If the pressures of the first light-path space 92, the second light-path space 93 and the wafer stage space 94 are denoted by Por, Pow and Pw, respectively, in the structure the following relation is satisfied:

$$Pow > Por, Pw \quad (1)$$

More preferably, $$Pow > Pw > Por \quad (2)$$

Where a first light-path space and a second light-path space are taken in a projection optical system, in an order of passage of light and from the reticle side, and where the space surrounding the wafer stage is taken as a wafer stage space, if the exposure is carried out while satisfying the aforementioned conditions of pressure of relations (1) and (2), it is assured to suppress deposition of contaminations produced from the wafer surface (resist), on the mirror surface.

By satisfying these relations, entry of outgas produced in the wafer stage space 94 and of contamination produced from the exposure region of the wafer during the exposure, into the second light-path space 93, can be well avoided. Additionally, pressure rise in the first light-path space can be prevented.

[Cryo-Panel Reactivation]

Figure 3:
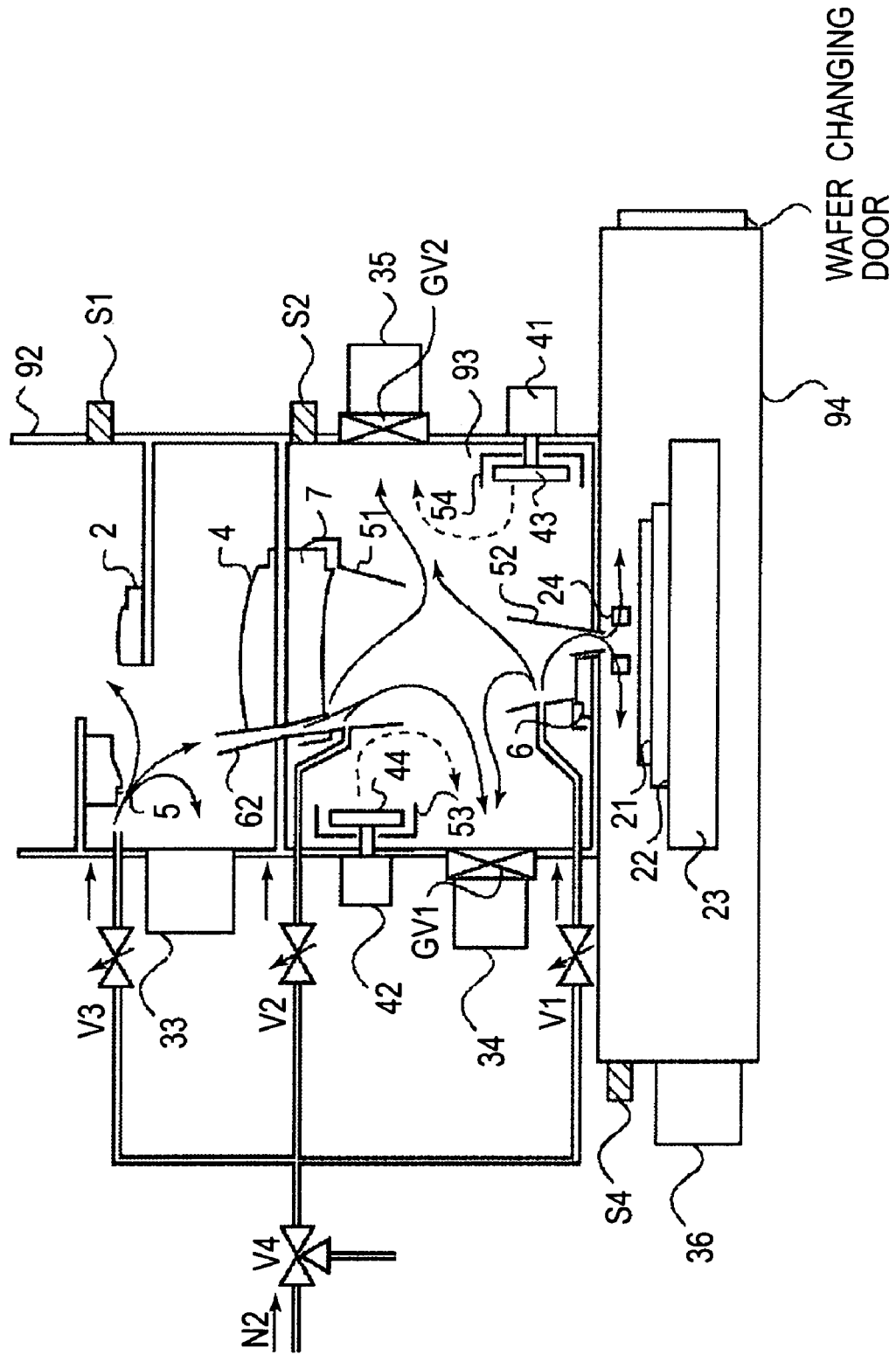
FIG. 3 is a schematic view for explaining the flow of gas during cryo-panel reactivation.

In the cryo-panel, as the amount of accumulation of molecules adhered to the surface thereof increases, the attracting (exhausting) speed thereof decreases gradually. Thus, it needs periodic reactivation (refresh). If the cryo-panel is reactivated without any specific measures, simply by raising the temperature of the cryo-panel to emit the substances adhered thereto, the substances having been attracted to the cryo-panel (e.g., moisture content in the chamber, outgases produced from various structural components, and contamination produced from the wafer surface) are scattered into the second light-path space. There is a high possibility that these substances are adhered to the mirrors. Thus, gases produced during the cryo-panel reactivation may be adhered to the mirrors and, after the cryo-panel reactivation, time is required until the pressure is reduced to a predetermined level. This causes degraded throughput. Additionally, if the exposure operation is initiated in a state that carbon series compound or moisture content is being adhered to the mirror, it causes oxidization of the mirror surface or degradation of the mirror reflectance. A specific measure is taken in the cryo-panel reactivation, in consideration of it, and this will be explained with reference to FIG. 3.

The valve V4 is switched to choose nitrogen, and nitrogen gas is supplied to the first light-path space 92 through the valve V3. Also, through the valves V2 and V1, nitrogen is supplied to the space surrounded by the radiation shield 51 and the sixth mirror of the projection system as well as to the space surrounded by the radiation shield 52 and the fifth mirror 6 of the projection system. Then, while operating the exhausting systems 34 and 35, the gate valves GV1 and GV2 are opened to thereby control the pressures in these spaces so that the following relations are satisfied:

$$Por > Pow, Pw \quad (3)$$

More preferably, $$Por > Pow > Pw \quad (4)$$

After this, reactivation of the cryo-panels 43 and 44 is initiated.

By controlling the pressure of the light-path spaces 92 and 93 at about 1-100 Pa while satisfying the aforementioned conditions, most of gasses produced from the cryo-panels 43 and 44 during the reactivation can be exhausted by means of the exhausting systems 34 and 35. Thus, scattering of gasses to the neighborhood of the fifth and sixth mirrors 6 and 7 of the projection system can be well avoided. Adhesion of substances on the mirror surfaces and scattering of them into the second light-path space 92 are therefore prevented, and entry of outgas produced in the wafer stage space 94 into the light-path space 93 can be avoided. Here, a valve (gas supply port) placed adjacent the mirror surface in the second light-path space may supply a gas into the second light-path space, and in that occasion, since the area around the mirror is at the most upstream position with respect to the gas flow inside the second light-path space, adhesion of substances scattered from the cryo-panel to the mirror surface can be prevented more.

In this embodiment, differential exhausting is used as a method of suppressing outgases in the reticle stage space. However, similar measures as done in the wafer stage space may be taken in the reticle stage space 91 and the fist light-path space 92. Although the pressure in the light path space as a whole slightly increases and the transmittance for the exposure light decreases as a result of it, entry of outgases present in the reticle stage space, into the light path space 92, can be prevented similarly.

Further, although the gas supply is switched so that helium is supplied for exposure and nitrogen is supplied for cryo-panel reactivation, only a single gas (e.g. helium) may be used. Alternatively, a gas having a high transmissivity to EUV light such as argon or hydrogen may be used.

A radiation shield disposed to prevent cooling of mirrors of the projection optical system by the cryo-panel may be temperature controlled by use of a heater, for example, and in that occasion, influence of radiation cooling by the cryo-panel upon the mirror (or chamber) can be reduced more.

This embodiment uses suppression by cryo-panel and suppression by gas (differential pressure), in combination. However, even if the cryo-panel is used during the exposure process without the gas supply, deposition of contamination produced from a wafer or the like upon the mirror can be prevented. Further, in accordance with the cryo-panel reactivation method of this embodiment, contamination of mirrors during the cryo-panel reactivation can be prevented. More specifically, if there is a structure that includes a cryo-panel 43 (44) disposed inside the second light-path space 93, a radiation shield member 52 (51) effective to prevent radiation cooling of the projection system mirror 6 (7) by the cryo-panel, and a gas supplying device for supplying a gas to the second light-path space 93, and if a gas supply port through which the gas is supplied to the second light-path space 93 by the supplying device is provided at a side of the radiation shield member 52 (51) facing the mirror 6, then it is possible to complete reactivation of the cryo-panel while preventing deposition of contaminant substances upon the mirror of the projection system.

As a further alternative, without using a cryo-panel, deposition of contaminations upon the mirror may be prevented on the basis of differential pressures created in these spaces.

Second Embodiment

Figure 4:
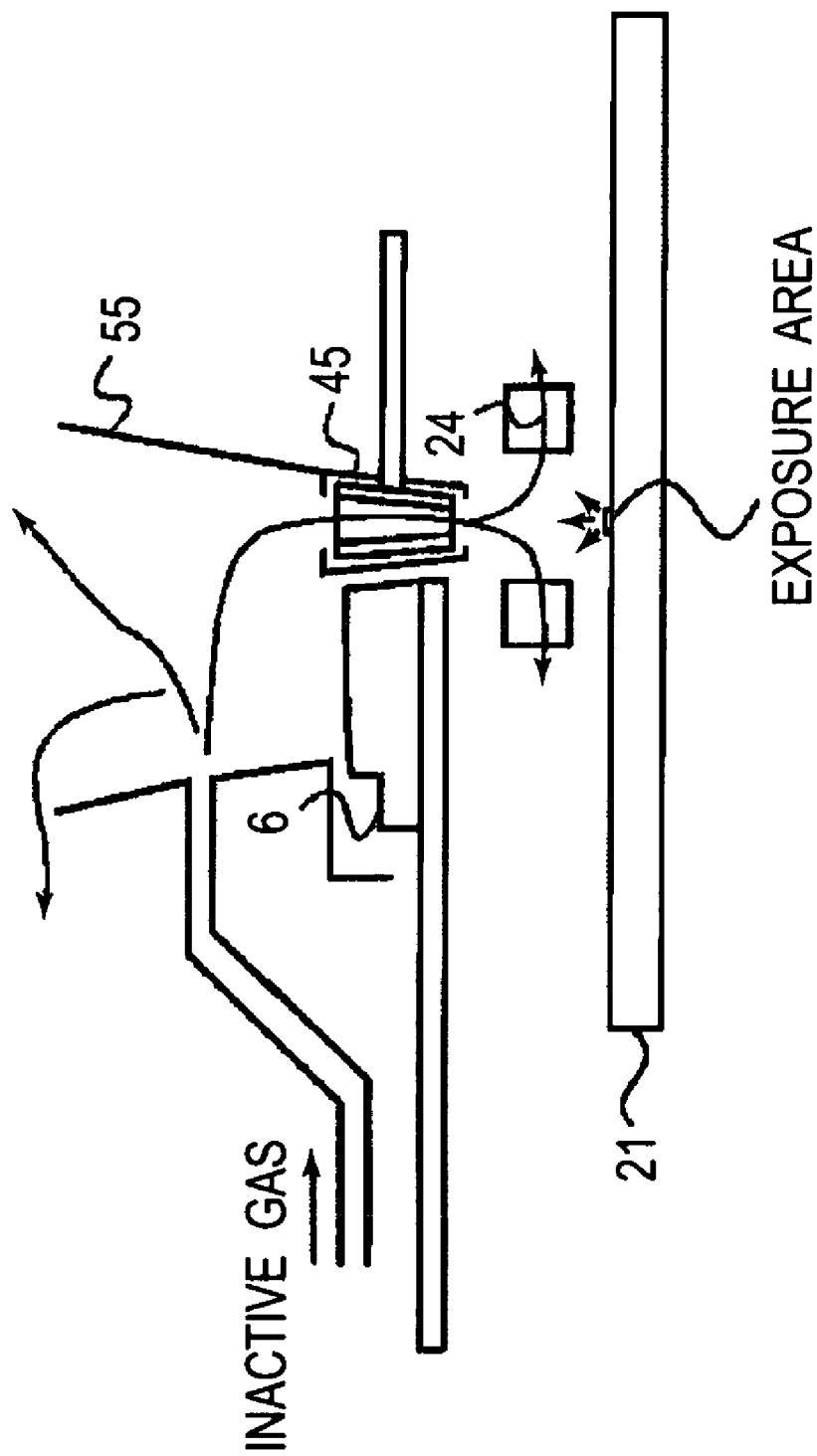
FIG. 4 is a schematic view, showing an example wherein a cryo-panel is disposed above an exposure region on the wafer surface.

FIG. 4 illustrates a structure according to a second embodiment of the present invention. FIG. 4 is an enlarged view of a portion around a fifth mirror 6 of the projection system. In this embodiment, a cryo-panel is disposed at a right-hand side of the fifth mirror 6 of the projection system, the cryo-panel having an opening for allowing passage of exposure light and having a radiation shield at its periphery. Like the first embodiment, gasses are supplied during the exposure process and during reactivation of the cryo-panel.

With the disposition of the cryo-panel 45 above the exposure area on the wafer surface, the path of contamination (contaminant substances) which might otherwise enter the light path space 93 due to scattering is deflected by the helium gas supplied through the valve V1. As a result, the probability that the contamination impinges on the cryo-panel 45 and is attracted (exhausted) thereby increases.

Figure 5:
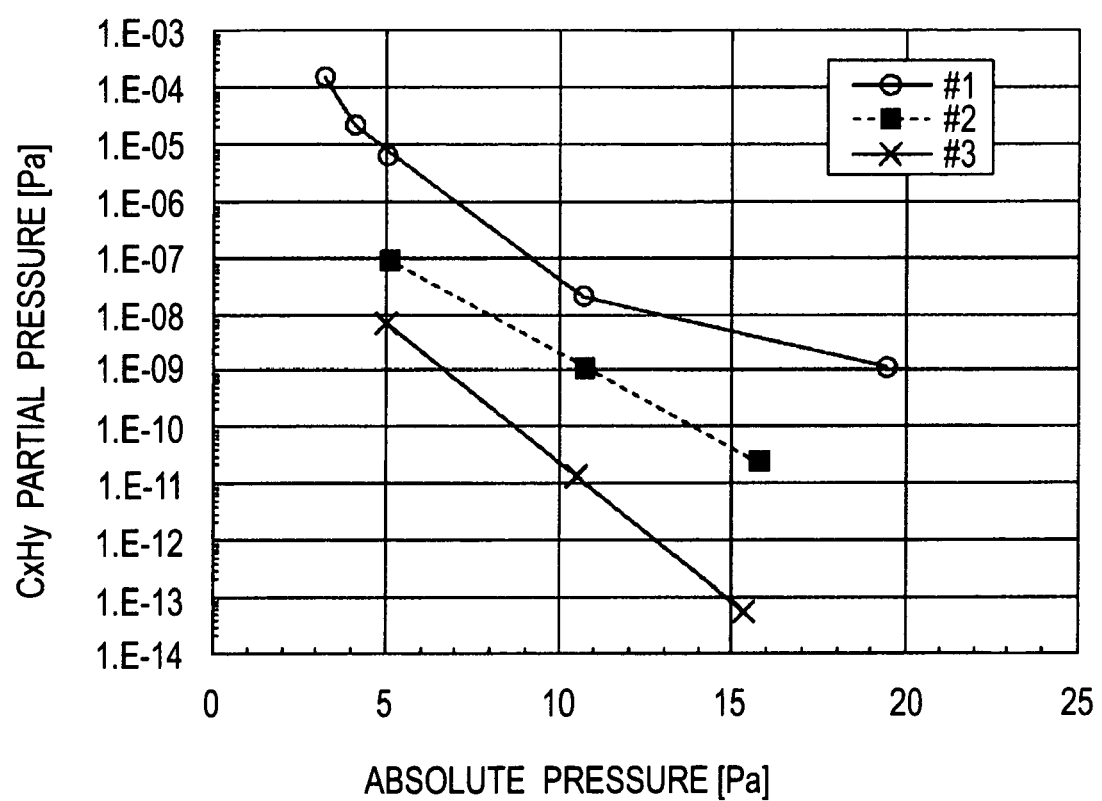
FIG. 5 is a graph for explaining advantageous results.

FIG. 5 illustrates this effect, being analyzed on the basis of thermal hydraulic simulation. FIG. 5 is a graph in which the absolute pressure of the second light-path space is taken on the axis of abscissa, while the partial pressure of contamination (CxHy) produced from the wafer surface during the exposure process and entering the second light-path space 93 is taken on the axis of ordinate. A curved line #1 (depicted with circles) shows the result of a case wherein only helium is supplied without operating any cryo-panel. A curved line #2 (depicted with painted squares) shows the result of a case wherein cryo-panels 43 and 44 are operated and also helium is supplied. A curved line #3 (depicted with crosses) shows the result of a case wherein cryo-panels 43, 44 and 45 are operated and also helium is supplied. In the case where the helium is not supplied, the partial pressure of CxHy was about 1E-4 Pa. It is seen from the graph that, with the results of curves #2 and #3, as compared with the condition of curve #1, at a lower pressure the adhesion of contamination produced from the wafer to the mirror can be suppressed effectively.

Thus, as compared with the first embodiment, a similar suppression effect is obtainable with use of smaller amount of helium supply.

Figure 6:
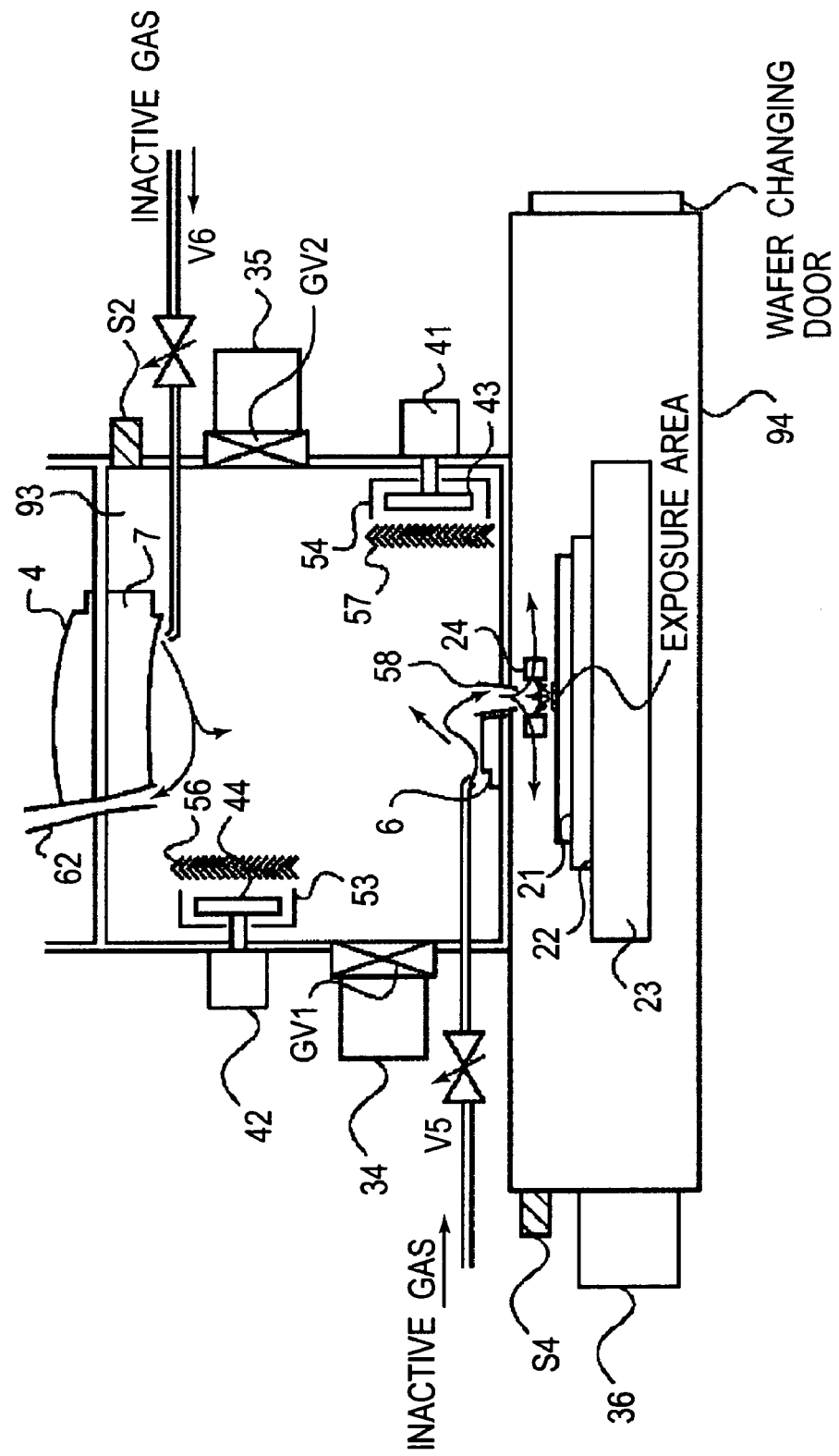
FIG. 6 is a schematic view of a general structure of an exposure apparatus according to another embodiment of the present invention.

In the preceding embodiment, radiation shields are disposed to surround mirrors. However, as shown in FIG. 6, like an ordinary cryo-pump, radiation shields 56 and 57 may be disposed to surround cryo-panels, and helium may be supplied to the fifth and sixth mirrors 6 and 7 of the projection system. In that occasion, since the cryo-panel is surrounded by a radiation shield, the exhausting speed of the cryo-panel may be slowed down. However, as compared with a case where only helium is supplied, the partial pressure of carbon compound inside the second light-path space 93 can be held at a lower level. The radiation shields 56 and 57 comprise a plurality of plate-like members each having a bent shape such as shown in FIG. 6. However, each plate-like member may have a different shape, that is, a straight or curved shape in section, for example.

Figure 7:
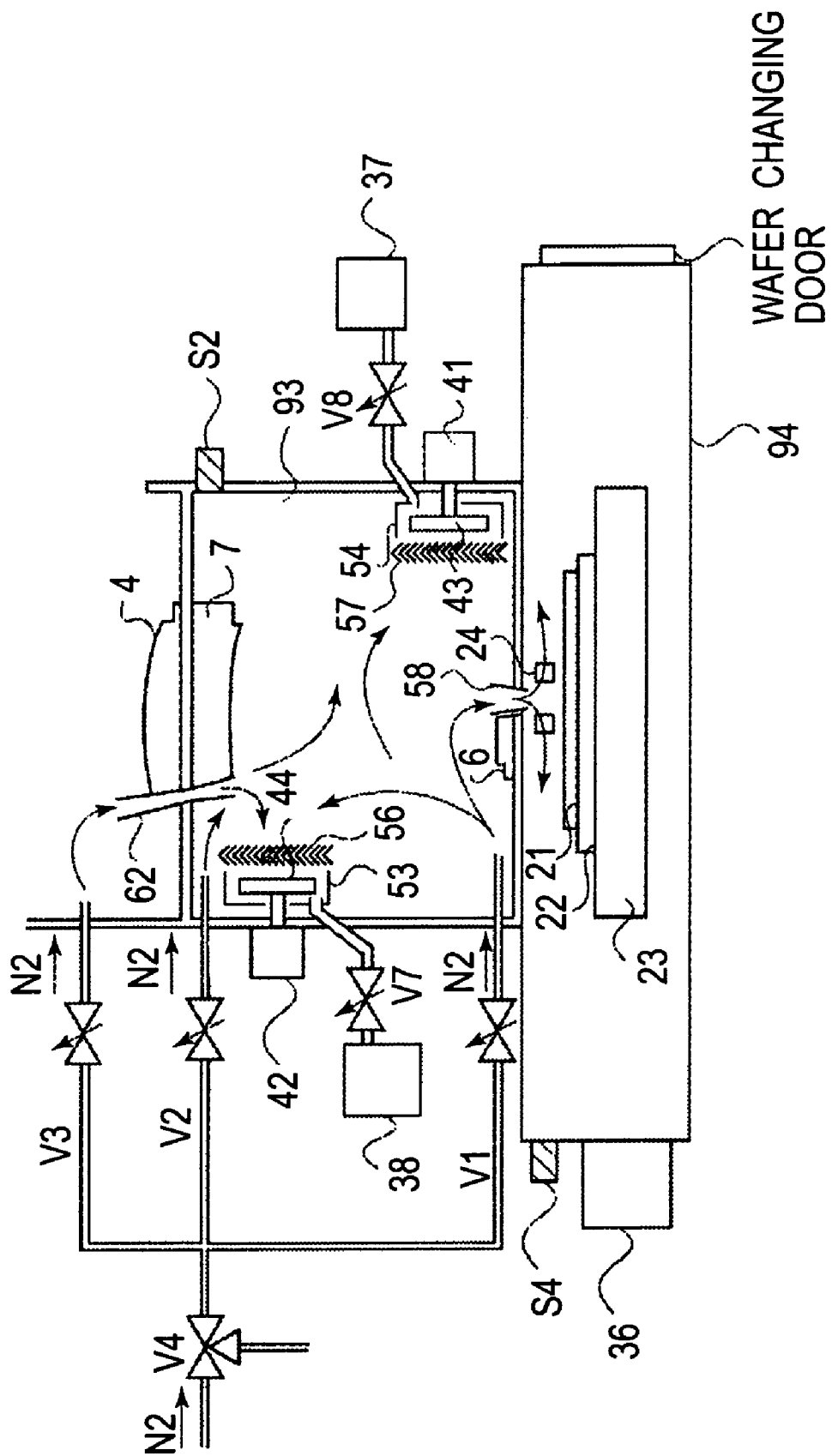
FIG. 7 is a schematic view for explaining cryo-panel reactivation in another embodiment of the present invention.
Figure 8:
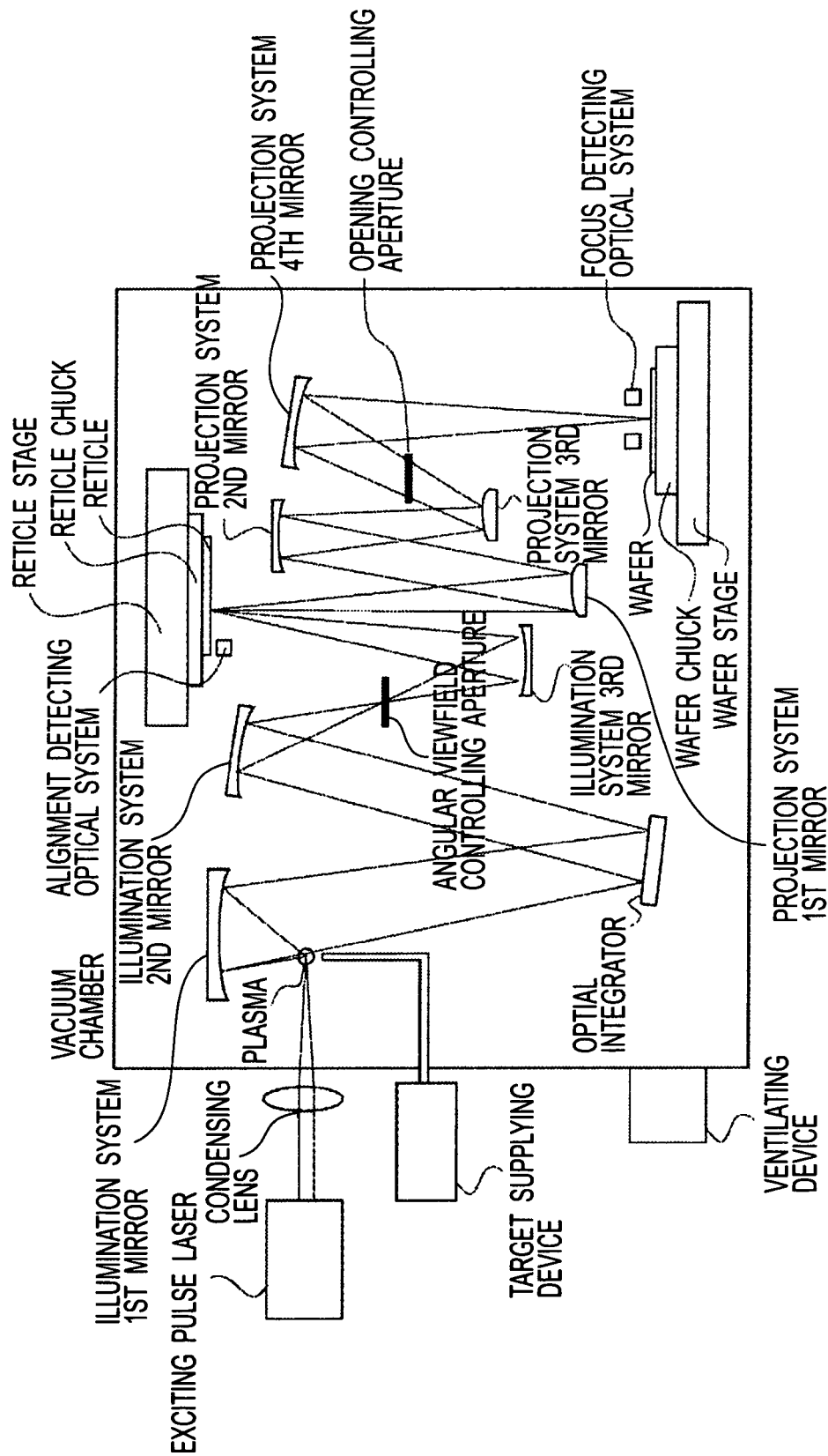
FIG. 8 is a schematic view of the structure of a conventional EUV exposure apparatus.

Also, in that occasion, there is no radiation shield that may function as a cover member surrounding the mirror in the cryo-panel reactivation. Therefore, even if helium is supplied to the mirror surface, it is no more possible to obtain a high suppression effect against gasses that contain contaminant substances scattered from the cryo-panel. In consideration of it, as shown in FIG. 7, exhausting flow passageways may desirably be defined inside the radiation shields 57 and 58 and, additionally, exhausting devices 37 and 38 may preferably be provided such that, for the reactivation, the valves V7 and V8 are opened and gasses are discharged out of the spaces surrounded by the radiation shields. By arranging the structure so that nitrogen inside the second light-path space 93 is discharged by means of the exhausting devices 37 and 38 as described above, unwanted rise of concentration of the contaminant substances emitted from the cryo-panel, in the vicinity of the mirror, can be prevented.

Furthermore, also in this embodiment, the radiation shield may be temperature controlled by use of a heater, for example, and in that occasion, influence of radiation cooling by the cryo-panel upon the mirror can be suppressed more.

This embodiment uses suppression by cryo-panel and suppression by gas, in combination. However, even if only the cryo-panel is used during the exposure process, mirror contamination during reactivation of the cryo-panel can be prevented once the reactivation is made in accordance with the cryo-panel reactivation method of this embodiment. More specifically, if there is a structure that includes a cryo-panel 43 (44) disposed inside the second light-path space 93, and members 54 and 57 (53 and 56) defining a space which accommodates the cryo-panel, and if an exhaust port is provided in the space accommodating the cryo-panel and an exhausting device is provided to exhaust gases through this exhaust port, then it is possible to prevent deposition of contaminant substances upon the mirror of the projection system during the reactivation of the cryo-panel.

In this embodiment, EUV light is used to perform the exposure. However, this embodiment is not limited to use of EUV light, and it can be applied also to any exposure apparatus provided that the exposure is carried out in a vacuum or a high vacuum. Furthermore, it can be applied suitably to an exposure apparatus wherein the exposure is carried out by using extreme ultraviolet light having a wavelength of 0.5 nm to 20 nm. Additionally, this embodiment is applicable to a case where contamination inside an exposure apparatus is removed by use of a cold trap, other than a cryo-panel.

Although, in the first and second embodiments, the chamber that accommodates therein optical elements of a projection optical system is divided into two spaces (i.e., first and second light-path spaces, or a reticle-side chamber and a wafer-side chamber), it may be divided into three or more spaces. In that occasion, preferably, the cryo-panel may be disposed in the space which is nearest to the wafer.

The cryo-panel may be disposed at the bottom face of the projection optical system (i.e. the face nearest to the wafer stage). In that occasion, however, in order to avoid excessive cooling of the wafer through the radiation cooling, a radiation shield may preferably be provided between the wafer and the cryo-panel.

In accordance with this embodiment, a cryo-panel is used in a light path space by which, for suppression of carbon compound produced from a wafer surface based on a gas such as helium having high transmissivity to EUV light, a desired suppression effect is obtainable with use of a lower pressure. Therefore, unwanted decrease of transmittance to EUV exposure light resulting from the pressure increase can be prevented, and thus a high throughput can be maintained.

Furthermore, since the amount of suppression gas supply is held low, the running cost can be made low.

Moreover, since scattering of accumulated gasses toward the mirrors during reactivation of the cryo-panel can be prevented, contamination of the mirror can be prevented effectively.

Third Embodiment

Next, referring to FIGS. 9 and 10, an embodiment of a device manufacturing method which uses an exposure apparatus described above, will be explained.

Figure 9:
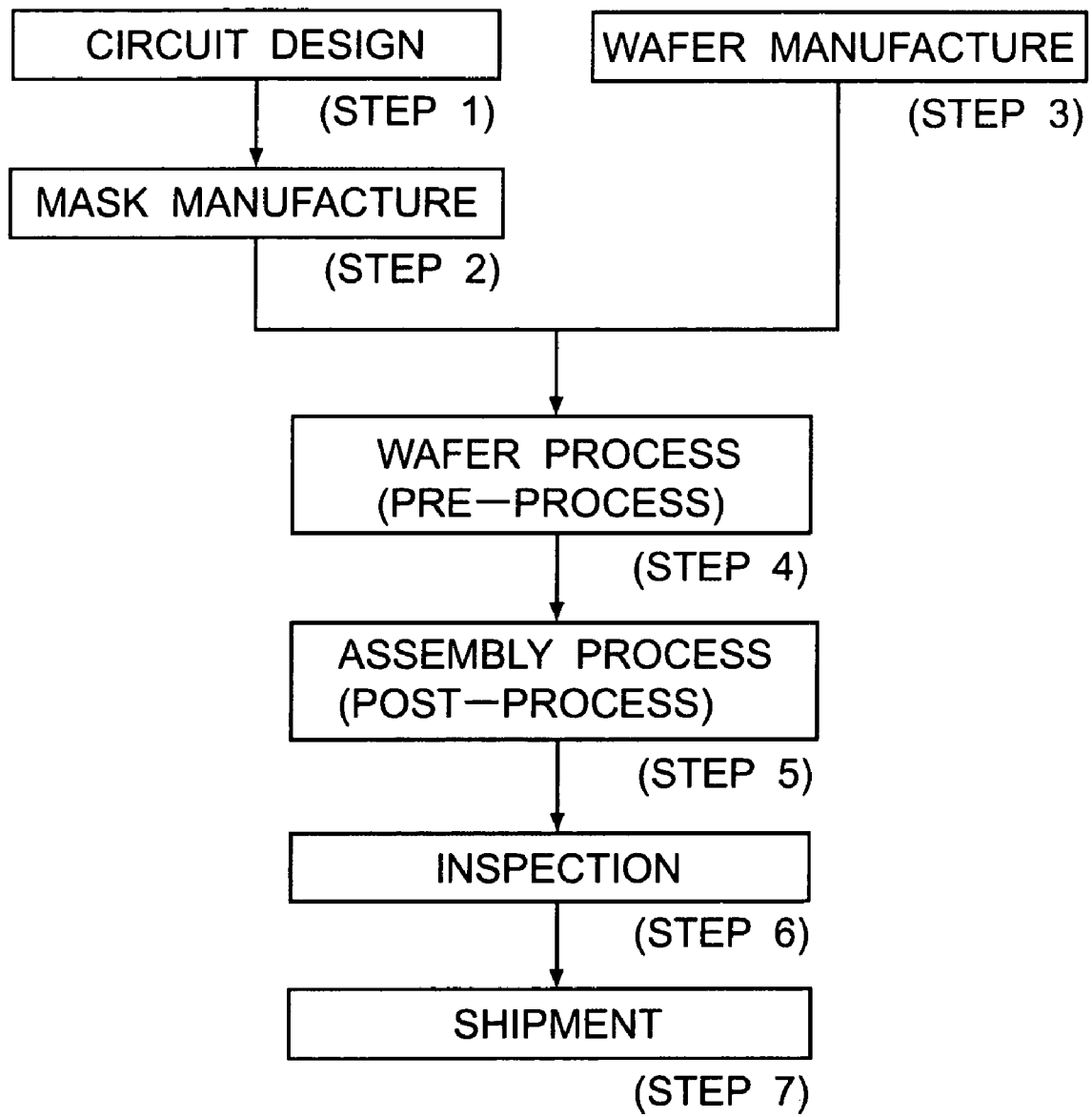
FIG. 9 is a flow chart for explaining procedure for manufacturing devices such as semiconductor chip (IC or LSI), LCD, or CCD, for example.

FIG. 9 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 10:
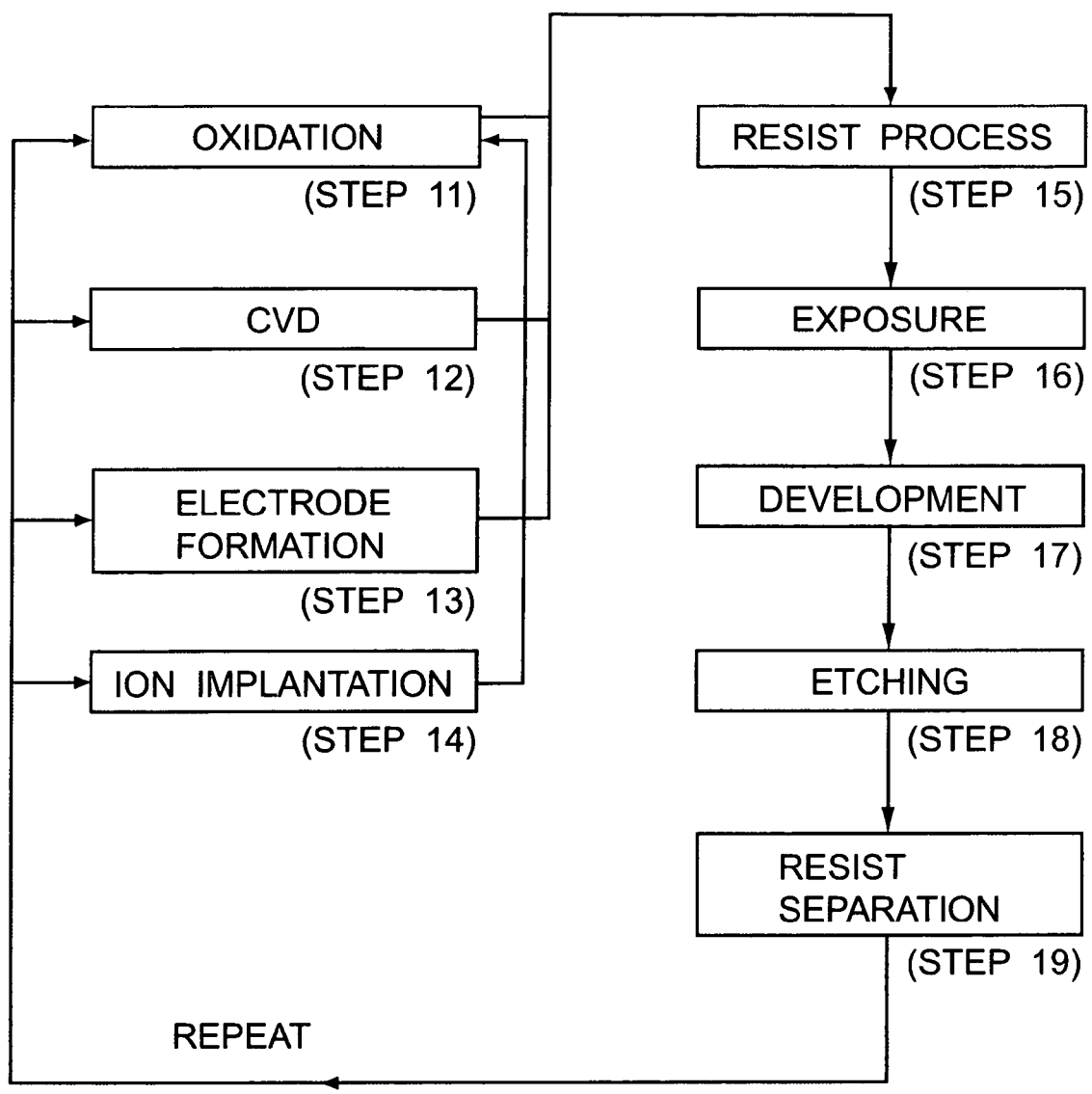
FIG. 10 is a flow chart for explaining details of a wafer process at step 4 in FIG. 9.

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high density microdevices can be manufactured.

As described, a device manufacturing method that uses an exposure apparatus as well as a device as a product thereof are also in the scope of the present invention.

While the present invention has been described with reference to some preferred embodiments individually, as a matter of course, these embodiments may be used in any combination.

While the invention has been described with reference to the structures disclosed herein, it is not confined to the details set forth and this application is intended to cover such modifications or changes as may come within the purposes of the improvements or the scope of the following claims.

This application claims priority from Japanese Patent Applications No. 2003-209519 and No. 2004-211693, filed Aug. 29, 2003 and Jul. 20, 2004, respectively, for which is hereby incorporated by reference.

What is claimed is:

1. An exposure apparatus, comprising:
   an illumination optical system for illuminating a reticle with extreme ultraviolet light;
   a projection optical system having a plurality of reflective optical elements, for directing light from the reticle to an object to be exposed;
   a chamber for surrounding a light path from the reticle to the object to be exposed;
   a cold trap plate provided in said chamber;
   a plate cooling device connected to said cold trap plate and configured to cool said cold trap plate to a temperature not greater than 200 K;
   a radiation shield member configured to be disposed between said cold trap plate and at least one of said plurality of reflective optical elements and to prevent radiation cooling of said at least one reflective optical element by said cold trap plate and
   a gas supplying device configured to supply a gas, through a gas supply port, to a space which is at a reflection surface side of said at least one reflective optical element that reflects the extreme ultraviolet light and which space is between said at least one reflective optical element and said radiation shield member;
   wherein said gas supply port is provided at said radiation shield member.

2. An exposure apparatus according to claim 1, wherein the gas supplied by said gas supplying device is inactive gas.

3. An apparatus according to claim 1, wherein said chamber includes a reticle-side chamber and a wafer-side chamber disposed in this order along the light path of extreme ultraviolet light and from the reticle side, the reticle-side chamber and the wafer-side chamber being configured to allow flow and passage, in back and forth directions, of a gas and light between said reticle-side chamber and said wafer-side chamber, and wherein said cold trap plate is disposed inside the wafer-side chamber.

4. An apparatus according to claim 3, wherein said cold trap plate has an opening and is disposed at an opening of the wafer-side chamber through which exposure light can pass.

5. An apparatus according to claim 3, wherein, when a pressure inside the wafer-side chamber is denoted by Pow and a pressure of the space surrounding the wafer is denoted by Pw, said cold trap plate is reactivated while satisfying a relation Pow>Pw.

6. An exposure apparatus according to claim 1, wherein said radiation shield member is temperature controlled.

7. An exposure apparatus according to claim 6, further comprising temperature measuring means for measuring a temperature of at least one reflective optical element, wherein the temperature of the reflective optical element is controlled within a predetermined temperature range on the basis of the measurement by said temperature measuring means.

8. An exposure apparatus according to claim 6, wherein said apparatus comprises at least two radiation shield members so that at least two levels of temperature setting can be made.

9. An exposure apparatus according to claim 1, further comprising an exhausting device configured to exhaust the gas supplied by said gas supplying device, through a gas exhaust port which is provided outside said space.

10. A device manufacturing method, comprising the steps of:

exposing an object to be exposed, by use of an exposure apparatus which includes an illumination optical system for illuminating a reticle with extreme ultraviolet light; a projection optical system having a plurality of reflective optical elements, for directing light from the reticle to an object to be exposed; a chamber for surrounding a light path from the reticle to the object to be exposed; a cold trap plate provided in said chamber; a plate cooling device connected to said cold trap plate and configured to cool said cold trap plate to a temperature not greater than 200 K; a radiation shield member configured to be disposed between said cold trap plate and at least one of said plurality of reflective optical elements and to prevent radiation cooling of said at least one reflective optical element by said cold trap plate; and a gas supplying device configured to supply a gas, through a gas supply port, to a space which is at a reflection surface side of said at least one reflective optical element that reflects the extreme ultraviolet light and which space is between said at least one reflective optical element and said radiation shield member, wherein said gas supply port is provided at said radiation shield member; and developing the exposed object.

* * * * *